Nov. 12, 1968 N. L. REYNER 3,411,045

ELECTRICAL CIRCUIT FOR RAPIDLY DRIVING AN INDUCTIVE LOAD

Filed March 30, 1966

NOEL L. REYNER
INVENTOR.

BY Charles C. Krawczyk

ATTORNEY

United States Patent Office 3,411,045
Patented Nov. 12, 1968

3,411,045

ELECTRICAL CIRCUIT FOR RAPIDLY DRIVING AN INDUCTIVE LOAD

Noel L. Reyner, Hilton, N.Y., assignor to Bausch & Lomb Incorporated, Rochester, N.Y., a corporation of New York Filed Mar. 30, 1966, Ser. No. 538,734
9 Claims. (Cl. 317—123)

ABSTRACT OF THE DISCLOSURE

A circuit is disclosed for rapidly driving an inductive load. Two switching circuits are connected in series circuits with the inductive load. One of the series circuits includes a resistive means to speed up its response. A switching signal is applied to the switching circuits so that the current flow through the circuit including the resistive means rises substantially faster than the other and drops off before the other reaches its peak current.

This invention relates to electrical circuits in general and more particularly to electrical circuits for rapidly driving inductive loads.

In many control systems, inductive loads such as motors, relays, clutches etc. require rapid pulses of current flowing therethrough to provide the desired degree of response and physical movement. Unfortunately, the time constant included in such highly inductive components radically reduces the rate at which current can flow therethrough. In order to increase the response time of such inductive devices, it is a well-known concept to include a series resistance. Unfortunately, in a case of high current inductive type loads, the use of the series resistance presents power dissipation problems thereby limiting the effective size of resistance that can be employed.

It is therefore an object of this invention to provide a new and improved electrical circuit for driving inductive loads.

It is also an object of this invention to provide a new and improved electrical circuit for rapidly driving inductive loads.

It is also an object of this invention to provide a new and improved circuit that drives inductive loads at high speeds with low power dissipation.

An electrical circuit for driving an inductive load including the invention comprises first and second switching circuits responsive to an input signal for providing a pair of current paths. The first switching circuit is connected in series with the inductive load to provide a first current path while the second switching circuit is connected through resistive means in series with the inductive load to provide a second current path. Input circuit means are coupled to both the first and second switching circuits in a manner so that the current flow through said second switching circuit increases substantially faster than through said first current path whereby said first and second switching circuits cooperate to provide a rapidly responding total current flow through said inductive load.

The novel features which are considered to be characteristic of this invention are set forth with particularity in the appended claims. The invention itself, however, both as to its organization and method of operation as well as additional objects and advantages thereof, will best be understood from the following description when read in connection with the accompanying drawings in which:

Figure 1:
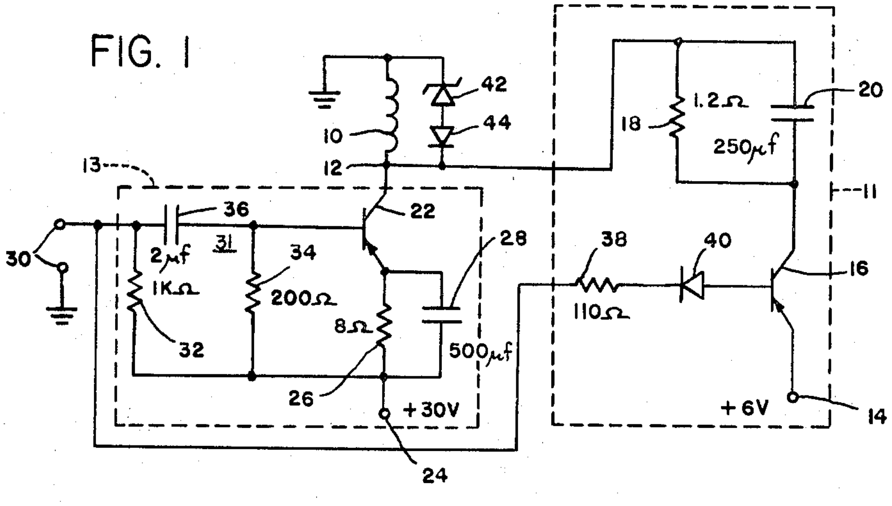
FIGURE 1 is a schematic diagram of an electrical circuit embodying the invention.

The electrical circuit of FIGURE 1 is connected to provide a rapidly responding current flow through an inductive load 10. One end of the load 10 is connected to ground while the other end is connected to a common junction point 12. A first switching circuit (within the dashed block 11) is connected between the common junction point 12 and a source point 14 (adapted to be connected to a source of energizing potential). The first switching circuit includes a transistor 16 having its emitter and collector electrodes connected in a series current path between the junction point 12 and the source point 14 through a parallel resistor-capacitor (RC) network, including a resistor 18 and a capacitor 20. A second switching circuit (within the dashed block 13) is connected between the common junction point 12 and the source point 24 (adapted to be connected to an energizing potential). The second switching circuit 13 includes a transistor 22 having its emitter and collector electrodes connected in series current path between the common terminal 12 and the source point 24 through a parallel RC network including a resistor 26 and a capacitor 28.

Input signals are applied across a pair of input terminals 30 and are coupled to the base electrode of the transistor 22 through a differentiating network 31 including the parallel resistors 32 and 34 and a series capacitor 36, and are also coupled to the base electrode of the transistor 16 through a current limiting resistor 38 and a protective diode 40. A Zener diode 42 is connected in series with a diode 44 across the inductive load 10 to prevent the generation of excessive voltages across the inductive load due to the switching currents applied thereto.

Figure 2:
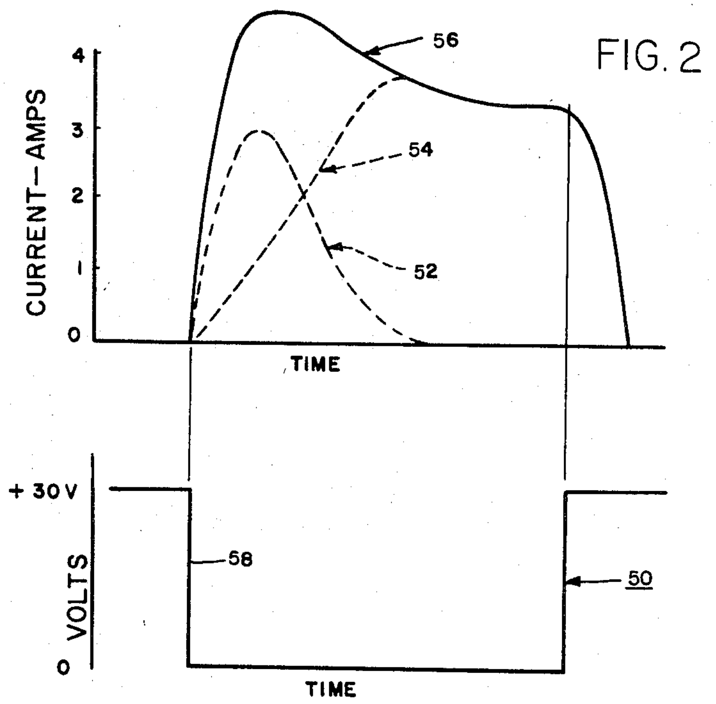
FIGURE 2 is a graphic representation of the current flow through portions of the circuit of FIGURE 1.

The operation of the circuit of FIGURE 1 will be explained with reference to the curves of FIGURE 2. The curve 50 represents an example input signal pulse applied across the terminals 30, which in the present embodiment is a square wave. The dashed curve 52 represents the current flow through the series circuit including the inductive load 10 and the switching circuit 13 while the dashed curve 54 represents the current flow through the series circuit including the inductive load 10 and the switching circuit 11. The curve 56 represents the total current flow through the inductive load 10.

The leading edge 58 of input pulse 50 is differentiated by the differentiation circuit 31 and applied to the base electrode of the transistor 22 as a negative going pulse which effectively saturates the transistor 22 for the duration of differentiated pulse. In the embodiment set forth in the FIGURE 1 and with an inductance in the order of 0.010 henrys, an eight ohm resistance (resistor 26) sufficiently lowers the time constant of the inductive circuit (the inductance to resistance ratio, $L/R$, of the series circuit including the switching circuit 13) so that a rapidly responding current can be driven through the inductive load 10 from a relatively high source of potential (30 v. at the source terminal 24). The capacitor 28 is connected across the resistor 26 to provide a second order type effect and thereby provide a still more highly responding system. In response to a signal pulse 50 of 30 volts at a frequency of 500 pulses/second, a current flow as designated by the curve 52 flows through the series circuit including an inductance load and the switching circuit 13.

The signal pulse 50 is also coupled through the resistor 38 and the diode 40 to the base electrode of the transistor 16 to saturate the transistor. The series resistor 18 in the switching circuit 11 has a substantially lower resistance value than the resistor 28 in the switching circuit 13 (1.2 ohms as compared to 8 ohms). As a result the time constant ($L/R$) of the series circuit including the inductive load 10 and the switching circuit 11 is longer than that of the series circuit including the inductive load 10 and the switching circuit 13. The capacitor 20 is coupled across the resistor 18 to provide a second order system and thereby further increase the response of the circuit. In response to the signal pulse 50 as previously described, a current flow as designated by the curve 54 flows through the series circuit including the inductive load 10 and the switching circuit 11. Both the currents through the inductor 10 (curves 52 and 54) flow simultaneously so they provide an adding effect to produce a total current as shown by the curve 56.

It should be noted, that the total current flow through the inductor 10 (curve 56) closely follows that of the applied signal pulse 50 with a minimum delay. It was found that the circuit functions effectively from D-C to at least 1000 pulses/second. In addition to the foregoing, the current flows through the higher value resistor 26 for only a short period of time, while current flows through the lower value resistor 18 is for the duration of the pulse. As a result, the combined action of the first and second switching circuits 11 and 13 provide a means of rapidly driving pulses of current through an inductive load with a minimum of heat dissipation. It is to be understood that the values assigned to the components of FIGURE 1 are illustrative, for example the resistor 18 can be reduced or eliminated if further reduced heat dissipation is desired without seriously degrading the overall response of the circuit.

I claim:

1. An electrical circuit for driving a load including an inductive reactance comprising:
- first and second switching circuits responsive to an input signal for providing a low impedance path;
- first circuit means connecting said first switching circuit in series with said load to provide a first current path;
- second circuit means including resistive means connecting said second switching circuit in series with said resistive means and said load to provide a second current path;
- third circuit means for applying a switching signal to said first and second switching circuits whereby the current flow through said second current path rises substantially faster than through said first path thereby providing a rapidly responding total current flow through said load.

2. An electrical circuit as defined in claim 1 wherein:
- each of said first and second switching circuit includes an amplifying device having first, second and control electrodes;
- said first circuit means connects said first and second electrodes of said amplifying device in said first switching circuit in series with said load;
- said second circuit means connect said first and second electrodes of said amplifying device in said first switching circuit in series with said load and resistive means and
- wherein said third circuit means applies a control signal to the control electrodes of said amplifying devices to render said amplifying devices conductive to provide a low impedance current path for said load.

3. An electrical circuit as defined in claim 2 wherein:
- said third circuit means includes a differentiation circuit for differentiatting the signal applied to said second circuit means so that the current flow through said second switching circuit reaches a peak value and drops off before the current flow through said first switching circuit approaches its peak value.

4. An electrical circuit as defined in claim 3 wherein:
- said first circuit means includes a parallel network including resistive and capacitive means and
- said second circuit means includes capacitive means in parallel with said resistive means.

5. The combination comprising:
- a load exhibiting an inductive reactance;
- first and second amplifying devices including a first, a second and a control electrode;
- first circuit means including resistive means coupling said first and second electrodes of said first amplifying device in a first series circuit with said load;
- second circuit means coupling said first and second electrodes of said second amplifying device in a second series circuit with said load;
- input signal means adapted for receiving input signals and apply said signals to the control electrodes of said first and second amplifying devices for rendering them conductive, said input signal means including a differentiation circuit for differentiating the signal that is applied to the control electrode of said first amplifying means so that a current pulse that is short compared to the input signal pulse flows through the first series circuit, while the signal applied to said control electrode of said second amplifying device causes current to flow in said second series circuit for at least the duration of the applied pulse, whereby said first and second amplifying devices cooperate to provide a rapidly responding current flow through said load.

6. The combination as defined in claim 5 wherein:
- said second circuit means includes a resistive means connected in series with said second series circuit, said resistive means having a resistance value lower than that of said resistive means included in said first circuit means.

7. The combination as defined in claim 5 wherein capacitive means are coupled in parallel with said resistive means in said first circuit means.

8. The combination as defined in claim 6 wherein:
- a first capacitive means are coupled in parallel with said resistive means in said first circuit means, and
- a second capacitive means are coupled in parallel with said resistive means in said second circuit means.

9. The combination as defined in claim 5 wherein said first and second amplifying devices are transistors.

References Cited

UNITED STATES PATENTS

| | | | |
|---|---|---|---|
| 3,126,490 | 3/1964 | Stern | 307—88.5 |
| 3,235,775 | 2/1966 | Winston | 317—148.5 |
| 3,268,045 | 8/1966 | Poumakis | 192—84 |
| 3,293,505 | 12/1966 | Miller | 317—148.5 |
| 3,339,120 | 8/1967 | McGrath et al. | 317—148.5 |

LEE T. HIX, *Primary Examiner.*

J. A. SILVERMAN, *Assistant Examiner.*